United States Patent
Po' et al.

(10) Patent No.: US 11,211,570 B2
(45) Date of Patent: Dec. 28, 2021

(54) HOLE TRANSPORTING MATERIAL AND PHOTOVOLTAIC DEVICE THAT USES IT

(71) Applicant: ENI S.P.A., Rome (IT)

(72) Inventors: Riccardo Po', Leghorn (IT); Alessandra Cominetti, Novara (IT)

(73) Assignee: ENI S.P.A., Rome (IT)

( * ) Notice: Subject to any disclaimer, the term of this patent is extended or adjusted under 35 U.S.C. 154(b) by 286 days.

(21) Appl. No.: 16/466,100

(22) PCT Filed: Dec. 22, 2017

(86) PCT No.: PCT/IB2017/058330
§ 371 (c)(1),
(2) Date: Jun. 3, 2019

(87) PCT Pub. No.: WO2018/122707
PCT Pub. Date: Jul. 5, 2018

(65) Prior Publication Data
US 2021/0280787 A1    Sep. 9, 2021

(30) Foreign Application Priority Data

Dec. 27, 2016    (IT) .................... 102016000131259

(51) Int. Cl.
*H01L 51/00*    (2006.01)
*H01L 51/44*    (2006.01)
(Continued)

(52) U.S. Cl.
CPC .... *H01L 51/009* (2013.01); *H01L 31/022425* (2013.01); *H01L 51/0037* (2013.01);
(Continued)

(58) Field of Classification Search
None
See application file for complete search history.

(56) References Cited

U.S. PATENT DOCUMENTS

| | | | |
|---|---|---|---|
| 2007/0265462 A1* | 11/2007 | Moller | C07C 253/34 558/311 |
| 2009/0042045 A1* | 2/2009 | Takimoto | C08F 287/00 428/461 |
| 2013/0264559 A1 | 10/2013 | Kugler et al. | |

FOREIGN PATENT DOCUMENTS

| | | |
|---|---|---|
| CN | 102460765 A | 5/2012 |
| CN | 103080203 A | 5/2013 |

(Continued)

OTHER PUBLICATIONS

Written Opinion and International Search Report for PCT/IB2017/058330 dated Jun. 13, 2018, 10 pages.

*Primary Examiner* — Dung A. Le
(74) *Attorney, Agent, or Firm* — Husch Blackwell LLP

(57) ABSTRACT

Hole transporting material obtained through a process comprising:
reacting at least one heteropoly acid containing at least one transition metal belonging to group 5 or 6 of the Periodic Table of the Elements; with
an equivalent amount of at least one salt or one complex of a transition metal belonging to group 5 or 6 of the Periodic Table of the Elements with an organic anion, or with an organic ligand;
in the presence of at least one organic solvent selected from alcohols, ketones, esters. Said hole transporting material can be advantageously used in the construction of photovoltaic devices (or solar devices) such as, for example, photovoltaic cells (or solar cells), photovoltaic modules (or solar modules), either on a rigid support, or on a flexible support. Furthermore, said hole transporting material can be advantageously used in the construction of Organic Light Emitting Diodes (OLEDs), or of Organic Field Effect Transistors (OFETs). In particular, said hole transporting material can be (Continued)

advantageously used in the construction of a polymer photovoltaic cell (or solar cell) with an inverted structure.

19 Claims, 1 Drawing Sheet

(51) Int. Cl.
*H01L 31/0224* (2006.01)
*H01L 51/50* (2006.01)

(52) U.S. Cl.
CPC ........ *H01L 51/0094* (2013.01); *H01L 51/441* (2013.01); *H01L 51/5056* (2013.01); *H01L 2251/308* (2013.01); *H01L 2251/552* (2013.01)

(56) References Cited

FOREIGN PATENT DOCUMENTS

| | | | |
|---|---|---|---|
| CN | 103400941 A | 11/2013 | |
| CN | 105765753 A | 7/2016 | |
| CN | 106103411 A | 11/2016 | |
| EP | 2445027 A1 | 4/2012 | |
| WO | 2015/137384 A1 | 9/2015 | |

* cited by examiner

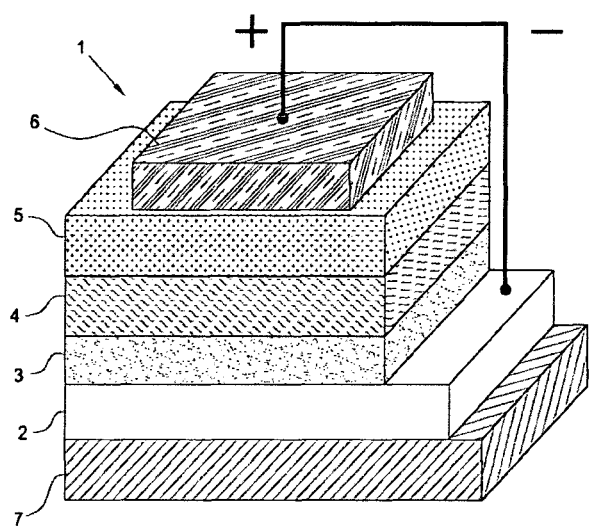

HOLE TRANSPORTING MATERIAL AND PHOTOVOLTAIC DEVICE THAT USES IT

FIELD OF THE INVENTION

The present invention relates to a hole transporting material and a photovoltaic device (or solar device) that uses it.

More in particular, the present invention relates to a hole transporting material obtained through a process comprising: reacting at least one heteropoly acid containing at least one transition metal belonging to group 5 or 6 of the Periodic Table of the Elements, with an equivalent amount of at least one salt or one complex of a transition metal belonging to group 5 or 6 of the Periodic Table of the Elements with an organic anion, or with an organic ligand, in the presence of at least one organic solvent selected from alcohols, ketones, esters.

Said hole transporting material can be advantageously used in the construction of photovoltaic devices (or solar devices) such as, for example, photovoltaic cells (or solar cells), photovoltaic modules (or solar modules), either on a rigid support, or on a flexible support. Furthermore, said hole transporting material can be advantageously used in the construction of Organic Light Emitting Diodes (OLEDs), or of Organic Field Effect Transistors (OFETs).

In particular, said hole transporting material can be advantageously used in the construction of a polymer photovoltaic cell (or solar cell) with an inverted structure. Consequently, the subject matter of the present invention is also a polymer photovoltaic cell (or solar cell) with an inverted structure comprising said hole transporting material.

BACKGROUND Photovoltaic devices (or solar devices) are devices able to convert the energy of light radiation into electrical energy. Currently, most of the photovoltaic devices (or solar devices) that can be used for practical applications exploit the chemical/physical properties of inorganic photoactive materials, in particular highly pure crystalline silicon.

Due to the high production costs of silicon, however, scientific research has been focusing for some time on the development of alternative organic materials having a polymeric structure [the so-called polymer photovoltaic cells (or solar cells)]. In fact, unlike highly pure crystalline silicon, said organic materials are characterized by a relatively easy synthesis, a low production cost, a reduced weight of the related organic photovoltaic device (or solar device), as well as allowing said organic materials to be recycled at the end of the life cycle of the device in which they are used.

The above-mentioned advantages therefore make the use of said organic materials energetically and economically attractive despite the possible lower photoelectric conversion efficiency (PCE) ($\eta$) of the organic photovoltaic devices (or solar devices) obtained with respect to inorganic photovoltaic devices (or solar devices).

The operation of organic photovoltaic devices (or solar devices), such as polymer photovoltaic cells (or solar cells), is based on the combined use of an electron acceptor compound and an electron donor compound.

In the state of the art, the most commonly used electron donor compound for the production of polymer photovoltaic cells (or solar cells) is regioregular poly(3-hexylthiophene) (P3HT). This polymer has excellent electronic and optical characteristics [e.g., good HOMO and LUMO orbital values, a good molar absorption coefficient ($\epsilon$)], a good solubility in the solvents used to produce polymer photovoltaic cells (or solar cells) and discrete mobility of electron holes.

Some examples of polymers that can be advantageously used as electron donor compounds are: the polymer PCDTBT {poly[N-9"-heptadecanyl-2,7-carbazole-alt-5,5-(4',7'-di-2-thenyl-2',1',3'-benzothiadiazol]}, the polymer PCPDTBT {poly[2,6-(4,4-bis-(2-ethylhexyl)-4H-cyclopenta[2,1-b:3,4-b']-dithiophene)-alt-4,7-(2,1,3-benzothiadiazole)]}, the polymer PffBT4T-2OD {poly[(5,6-difluoro-2,1,3-benzothiadiazole-4,7-diyl)-alt-(3,3'''-di(2-octyldodecyl)-2,2';5',2'';5'',2'''-quaterthiophene-5,5''-diyl)]}.

In the state of the art, the electron acceptor compounds most frequently used in the construction of polymer photovoltaic cells (or solar cells) are fullerene derivatives such as, for example, [6,6]-phenyl-$C_{61}$-butyric acid methyl ester (PCBM), (6,6)phenyl-$C_{71}$-butyric acid methyl ester (PC71BM). Said fullerene derivatives have led to the highest efficiencies when mixed with electron donor compounds selected from $\pi$-conjugated polymers such as, for example, polythiophenes ($\eta$>5%), polycarbazoles ($\eta$>6%), derivatives of poly(thienothiophene)-benzodithiophene (PTB) ($\eta$>8%), fluorinated polymers of benzothiadiazole ($\eta$>10%).

The elementary conversion process of light into electrical current in a polymer photovoltaic cell (or solar cells) takes place through the following steps:

1. Absorption of a photon by the electron donor compound with the formation of an exciton, i.e. a pair of electron-electron hole charge carriers;
2. diffusion of the exciton in a region of the electron donor compound up to the interface with the electron acceptor compound, in which its dissociation can take place;
3. dissociation of the exciton in the two charge carriers: electron (−) in the accepting phase (i.e. in the electron acceptor compound) and electron hole (+) in the donor phase (i.e. in the electron donor compound);
4. carrying the charges thus formed to the cathode [electron (−) through the electron acceptor compound] and to the anode [electron hole (+) through the electron donor compound], with the generation of an electric current in the polymer photovoltaic cell (or solar cell) circuit.

The photoabsorption process with the formation of the exciton and subsequent transfer of an electron to the electron acceptor compound implies the excitation of an electron from the HOMO (Highest Occupied Molecular Orbital) to the LUMO (Lowest Unoccupied Molecular Orbital) of the electron donor compound and, subsequently, the passage from this to the LUMO of the electron acceptor compound.

Since the efficiency of a polymer photovoltaic cell (or solar cell) depends on the number of free electrons generated by dissociation of the excitons, one of the structural characteristics of electron donor compounds that has the greatest effect on such efficiency is the difference in energy between the HOMO and LUMO orbitals of the electron donor compound, (the so-called band-gap). From this difference depends, in particular, the wavelength of the photons that the electron donor compound is able to harvest and effectively convert into electrical energy, (the so-called photon harvesting or light harvesting process).

From the point of view of the electronic characteristics, the improvements in relation to the materials used in the construction of polymer photovoltaic cells (or solar cells) are possible through the design of the molecular structure of the electron donor compound and of the electron acceptor compound for the purpose of regulating the energy levels (HOMO-LUMO) of both in an optimal way. In particular, in order to obtain the dissociation of the exciton formed in the process and to prevent the re-transfer of charge, it is necessary for the differences both between the HOMOs of the electron donor compound and of the electron acceptor compound, and between the LUMOs of the electron donor compound and the electron acceptor compound, to have an optimal value ranging from 0.3 eV to 0.5 eV. Furthermore, the band gap, i.e. the difference in energy between the HOMO and LUMO of the electron donor compound, must on one hand not be too high so as to allow the absorption of the highest number of photons but, on the other hand, not be too low as this could reduce the voltage at the electrodes of the polymer photovoltaic cell (or solar cell).

Another important characteristic of the materials used in the construction of polymer photovoltaic cells (or solar cells) is the mobility of the electrons in the electron acceptor compound and of the electron holes in the electron donor compound, which determines the ease with which the electric charges, once photogenerated, reach the electrodes. The electron mobility, i.e. the mobility of the electrons in the electron acceptor compound and of the electron holes in the electron donor compound, as well as being an intrinsic property of the molecules, is also strongly influenced by the morphology of the photoactive layer, which in turn depends on the mutual miscibility of the compounds used in said photoactive layer and their solubility. For that purpose, the phases of said photoactive layer must not be either too dispersed or too segregated.

The morphology of the photoactive layer is also critical in relation to the effectiveness of the dissociation of the electron hole-electron pairs photogenerated. In fact, the average lifetime of the exciton is such that it can diffuse into the organic material for an average distance of no more than 10 nm-20 nm. Consequently, the phases of the electron donor compound and of the electron acceptor compound must be organized in nanodomains of comparable dimensions to this diffusion distance. Furthermore, the area of contact between the electron donor compound and the electron acceptor compound must be as large as possible and there must be preferential paths towards the electrical contacts. Furthermore, such morphology must be reproducible and not change over time.

In the simplest operating method, the polymer photovoltaic cells (or solar cells) are made by introducing between two electrodes, usually made of indium tin oxide (ITO) (anode) and aluminum (Al) (cathode), a thin layer (about 100 nanometers) of a mixture of the electron acceptor compound and of the electron donor compound [bulk heterojunction]. Generally, for the purpose of creating a layer of this type, a solution of the two compounds (i.e. electron acceptor compound and electron donor compound) is prepared and, subsequently, a photoactive layer is created on the anode [indium tin oxide (ITO)] based on said solution, making use of appropriate application techniques such as, for example, spin-coating, spray-coating, ink-jet printing, slot die coating, gravure printing, screen printing, and the like. Finally, the counter electrode [i.e. the aluminum cathode (Al)] is deposited on the dried photoactive layer through known techniques, for example, through evaporation. Optionally, between the anode and the photoactive layer and/or between the cathode and the photoactive layer, other additional layers can be introduced (known as buffer layers) able to perform specific functions of an electric, optical, or mechanical nature.

Generally, for example, for the purpose of helping the electron holes to reach the anode [indium tin oxide (ITO)] and at the same time to stop electrons being carried, hence improving the charge harvesting by the anode and inhibiting recombination phenomena, before creating the photoactive layer starting from the mixture of the electron acceptor compound and the electron donor compound as described above, a layer is deposited, based on an aqueous suspension comprising PEDOT:PSS [poly(3,4-ethylenedioxythiophene):polystyrene sulfonate], making use of appropriate application techniques such as, for example, spin-coating, spray-coating, ink-jet printing, slot die coating, gravure printing, screen printing, and the like.

More details on the different deposition techniques can be found for example, in Krebs F. C., in "*Solar Energy Materials & Solar Cells*" (2009), Vol. 93, pag. 394-412. The polymer photovoltaic cells (or solar cells) with an inverted structure, generally mentioned in literature, instead comprise the following layers: (i) a support made of transparent material; (ii) an indium tin oxide (ITO) cathode; (iii) a cathode buffer layer that has the function of electron carrier and of electron hole barrier, generally comprising zinc oxide; (iv) a photoactive layer comprising an electron donor compound and an electron acceptor compound generally selected from those mentioned above; (v) an anode buffer layer that has the function of electron hole carrier and of electron barrier comprising a hole transporting material, generally selected from molybdenum oxide, tungsten oxide, vanadium oxide, (vi) an anode, generally made of silver (Ag), gold (Au) or aluminum (Al). Generally, for the purpose of protecting said polymer photovoltaic cells (or solar cells), either with traditional architecture, or with an inverted structure, from mechanical strain and from atmospheric agents, and for their use in real conditions, said photovoltaic cells (or solar cells) are encapsulated in an appropriate material [for example, hybrid multilayer films based on poly(ethylene terephthalate), inorganic oxides].

Generally, the aforementioned anode buffer layer is obtained through a deposition process of the molybdenum oxide (or, alternatively, of the tungsten or vanadium oxide) carried out through vacuum evaporation of said molybdenum oxide, at high temperature and high vacuum (for example, $10^{-5}$ mm Hg-$10^{-7}$ mm Hg). However, said deposition process has some drawbacks such as, for example: lengthy process as the deposition chamber needs to be brought to the required pressures and sufficient time is needed to reach the necessary material thickness for the operation of the final photovoltaic cell (or solar cell) and, therefore, longer process times and an increase in process costs; high energy consumptions; significant waste of material mainly due to the fact that the oxide vapors fill the deposition chamber and are deposited uniformly on a much larger surface area than the effectively necessary one, corresponding to the final photovoltaic cell (or solar cell).

In order for the aforementioned polymer photovoltaic cells (or solar cells) with an inverted structure to be used in a large-scale industrial application, it is therefore necessary for suitable production processes to be developed, able to overcome the aforementioned drawbacks. Efforts have therefore been made in that sense.

For example, Välimäki M. et al., in "*Nanoscale*" (2015), Vol. 7, pag. 9570-9580, describe a process for manufacturing organic photovoltaic (OPV) modules with an inverted structure through roll-to-roll (R2R) printing using the following deposition techniques: gravure printing and rotary screen-printing. In said organic photovoltaic (OPV) modules with an inverted structure the anode buffer layer comprises PEDOT:PSS [poly(3,4-ethylenedioxythiophene):polystyrene sulfonate] and is obtained through rotary screen-printing.

However, as reported, for example, by Dkhil S. B. et al., in "*Advanced Energy Materials*" (2016), Vol. 6, 1600290, the use of anode buffer layers comprising different materials from molybdenum oxide generally causes a reduction in the efficiencies of the organic solar cells obtained: in fact, organic solar cells in which the anode buffer layer is obtained through a deposition process of the molybdenum oxide carried out by vacuum evaporation of said molybdenum oxide, have an efficiency greater than 9%. Furthermore, the use of PEDOT:PSS [poly(3,4-ethylenedioxythiophene): polystyrene sulfonate], generally in aqueous suspension or in mixed water/alcohol solvents, as the material for the anode buffer layer, shows some drawbacks from a practical point of view, known to a person skilled in the art. The first drawback is represented by the strong acidity of the solution used which generally has a pH equal to 2 or 3, leading to long-term instability of the polymer photovoltaic cells (or solar cells), caused by the gradual corrosion of the anode with which said anode buffer layer is in contact, or of the cathode, followed by the slow diffusion of the $H^+$ ions through the photoactive layer. A second drawback is represented by the fact that the aqueous suspension has very poor wettability properties with respect to the photoactive layer: this causes a non-uniform coverage of the layer itself and therefore a reduction of the effectiveness of the anode buffer layer in acting as an electron hole carrier layer. It is possible to overcome this drawback by changing said suspension with the addition of appropriate surfactants but this, on one hand, leads to an increase in the cost of the material and, on the other, to a reduction in conductivity of said anode buffer layer, since the surfactants behave like electrical insulators.

Therefore, the use of PEDOT:PSS [poly(3,4-ethylenedioxythiophene):polystyrene sulfonate], is not an optimal solution in the manufacturing of polymer photovoltaic cells (or solar cells) and it is therefore of great interest to identify alternative routes. Among the alternative materials to PEDOT:PSS [poly(3,4-ethylenedioxythiophene):polystyrene sulfonate] proposed by the scientific community, soluble derivatives of molybdenum or of vanadium can be cited. For example, Xu M.-F. et al., in "*Organic Electronics*" (2013), Vol. 14, pag. 657-664, describe the use of an aqueous solution of $MoO_3$ as the anode buffer layer in conventional organic solar cells [comprising poly(3-hexylthiophene) (P3HT) and fullerene] with a bulk heterojunction. However, this solution cannot be used in solar cells with an inverted structure, since said aqueous solution would not be able to suitably wet the photoactive layer.

Liu J. et al., in "*Journal of Materials Chemistry C*" (2014), Vol. 2, pag. 158-163, describe the use of a $MoO_3$ solution in ammonia-water as an anode buffer layer that is deposited on the anode [indium-tin oxide (ITO)] through spin-coating and subsequently subjected to an annealing heat treatment at 150° C., for 20 minutes. Said solution is also used in conventional organic solar cells [comprising poly(3-hexylthiophene) (P3HT) and fullerene] with a bulk heterojunction and cannot be used in solar cells with an inverted structure due to the same drawbacks described above. Furthermore, the aforementioned annealing heat treatment is carried out at a temperature that is not compatible with the use of flexible plastic supports or for too much time for a high speed deposition process (10 m-50 m per minute).

Murase S. et al., in "*Advanced Materials*" (2012), Vol. 24, pag. 2459-2462, describe the use of a $MoO_3$ solution obtained by thermal decomposition, in deionized water, of ammonium heptamolybdate as a precursor, as the anode buffer layer that is deposited on the anode [indium-tin oxide (ITO)] through spin-coating. Also in this case the solution is used in conventional organic solar cells (i.e. not having an inverted structure) because of the wettability problems of the active layer.

Hammond S. R. et al., in "*Journal of Materials Chemistry*" (2012), Vol. 22, pag. 3249-3254, describe the use of a molybdenum oxide ($MoO_x$) solution obtained by thermal decomposition, in acetonitrile, of tricarbonyltris(propionitrile)molybdenum as a precursor, as the anode buffer layer that is deposited on the anode [indium-tin oxide (ITO)] through spin-coating. The acetonitrile solution of tricarbonyltris(propionitrile)molybdenum is prepared in an inert atmosphere due to the instability of said precursor. Said instability, the very high cost of the precursor and the known toxicity of metallo-carbonyl derivatives, make the process described therein not suitable for use in a large-scale industrial process.

Zilberg K. et al., in "*Applied Materials & Interfaces*" (2012), Vol. 4, pag. 1164-1168, describe the use of a solution of $MoO_x$ obtained by thermal decomposition, in iso-propanol (containing about 0.1% water), of bis(2,4-pentanedionate)molybdenum(IV)dioxide as a precursor, as the anode buffer layer that is deposited on the anode (Ag) through spin-coating and subsequently subjected to an annealing heat treatment at 110° C., for 1 hour. These lengths of time are absolutely incompatible with a high speed deposition process (10 m-50 m per minute). Zhu Y. et al., in "*Journal of Materials Chemistry A*" (2014), Vol. 2, pag. 1436-1442, describe the use of a solution of phosphomolybdic acid (PMA), in iso-propanol, as an anode buffer layer that is deposited on the anode (Ag) through spin-coating and subsequently subjected to a an annealing heat treatment at 150° C., for 90 minutes. The organic solar cells with an inverted structure comprising said buffer layer are said to have efficiencies that are comparable or slightly higher than those of the solar cells with an inverted structure comprising an anode buffer layer obtained through a deposition process of the molybdenum oxide carried out through evaporation of said molybdenum oxide. However, the intrinsic acidity of phosphomolybdic acid represents a potentially corrosive element for the organic solar cells obtained. Furthermore, the lengthy times for carrying out said heat treatment are not compatible with a roll-to-roll (R2R) printing process.

Chinese patent application CN 103400941 relates to an organic solar cell based on a modified anode layer comprising: a cathode, a modified cathode buffer layer, a bulk heterojunction active layer, a modified anode buffer layer and an anode; wherein said modified anode buffer layer is based on a heteropoly acid having formula $H_x(MM'_{12}O_{40})$ wherein M is phosphorous (P) or silicon (Si), M' is molybdenum (Mo) or tungsten (W), X is 3 or 4; the cathode is indium tin oxide (ITO); the modified cathode buffer layer is zinc oxide; the bulk heterojunction active layer is a mixture of compounds such as poly(3-hexylthiophene) (P3HT) and fullerene; the anode is silver or aluminum. However, also in this case, the acidity of the heteropoly acid used as an anode buffer layer, represents a potentially corrosive element for the solar cell.

Vasilopoulou M. et al., in "*Journal of the American Chemical Society*" (2015), Vol. 137(21), pag. 6844-6856, describe the use of polyoxometalates (POM) of the Keggin and Dawson type as cathode buffer layers in high efficiency optoelectronic devices. Said cathode buffer layers act as electron carriers and hole blockers.

The Applicant therefore set out to solve the problem of finding a hole transporting material able to be advantageously used in photovoltaic devices (or solar devices), in particular in polymer photovoltaic cells (or solar cells) with an inverted structure, able to overcome the drawbacks described above.

SUMMARY

The Applicant has now found a hole transporting material obtained through a process comprising: reacting at least one heteropoly acid containing at least one transition metal belonging to group 5 or 6 of the Periodic Table of the Elements, with an equivalent amount of at least one salt or one complex of a transition metal belonging to group 5 or 6 of the Periodic Table of the Elements with an organic anion, or with an organic ligand, in the presence of at least one organic solvent selected from alcohols, ketones, esters. Said hole transporting material can be advantageously used in the construction of photovoltaic devices (or solar devices), such as photovoltaic cells (or solar cells), photovoltaic modules (or solar modules), either on a rigid support, or on a flexible support. Furthermore, said hole transporting material can be advantageously used in the construction of Organic Light Emitting Diodes (OLEDs), or of Organic Field Effect Transistors (OFETs). In particular, said hole transporting material can be advantageously used in the construction of a polymer photovoltaic cell (or solar cell) with an inverted structure having photoelectric conversion efficiency (η) and open circuit voltage (Voc), short-circuit current density (Jsc) and fill factor (FF) values that are comparable to or even higher than those of polymer photovoltaic cells (or solar cells) with an inverted structure known in the state of the art comprising an anode buffer layer obtained based on an aqueous suspension comprising PEDOT:PSS [poly(3,4-ethylenedioxythiophene):polystyrene sulfonate]. Furthermore, said polymer photovoltaic cell (or solar cell) with an inverted structure is able to maintain said values over time, in particular, in terms of photoelectric conversion efficiency (η). Furthermore, said hole transporting material can be advantageously used in high speed printing processes. Therefore, the subject matter of the present invention is a hole transporting material obtained by reacting:
- at least one heteropoly acid containing at least one transition metal belonging to group 5 or 6 of the Periodic Table of the Elements; with
- an equivalent amount of at least one salt or one complex of a transition metal belonging to group 5 or 6 of the Periodic Table of the Elements with an organic anion, or with an organic ligand;
- in the presence of at least one organic solvent selected from alcohols, ketones, esters.

BRIEF DESCRIPTION OF THE FIGURES

FIG. 1 is a cross sectional view of a polymer photovoltaic cell (or solar cell) with an inverted structure, in accordance with emodiments of the present disclosure.

DETAILED DESCRIPTION

For the purpose of the present description and following claims, the definitions of the numeric ranges always include the extremes unless specified otherwise.

For the purpose of the present description and of the following claims, the term "Periodic Table of the Elements" refers to the "IUPAC Periodic Table of the Elements", version dated 8 Jan. 2016, available on the following website: https://iupac.org/what-we-do/periodic-table-of-elements/.

For the purpose of the present description and of the following claims, the term "transition metal belonging to group 5 or 6 of the Periodic Table of the Elements" means metals belonging to said group 5 or 6, excluding transuranic metals.

For the purpose of the present invention, any salt or complex of a transition metal belonging to group 5 or 6 of the Periodic Table of the Elements can be used with an organic anion or with an organic ligand as long as it is soluble in the pre-selected organic solvent.

For the purpose of the present description and of the following claims, the term "soluble in the organic solvent" means that said salt or complex of a transition metal belonging to group 5 or 6 of the Periodic Table of the Elements with an organic anion or with an organic ligand has a dissociation constant such as to make the cation available for the reaction.

In accordance with a preferred embodiment of the present invention, said heteropoly acid can be selected, for example, from heteropoly acids having general formula (I):

$$H_x[A(MO_3)_yO_z] \quad (I)$$

in which:
A represents a silicon atom, or a phosphorus atom;
M represents an atom of a transition metal belonging to group 5 or 6 of the Periodic Table of the Elements, preferably selected from molybdenum, tungsten;
x is an integer that depends on the valence of A; preferably it is 3 or 4;
y is 12 or 18;
z is 4 or 6.

In accordance with a further preferred embodiment of the present invention, said heteropoly acid can be selected, for example, from heteropoly acids having general formula (II):

$$H_x[A(Mo)_p(V)_qO_{40}] \quad (II)$$

in which:
A represents a silicon atom, or a phosphorus atom;
x is an integer that depends on the valence of A; preferably it is 3 or 4;
p is 6 or 10;
q is 2 or 6.

For the purpose of the present invention, said heteropoly acids having general formula (I) and said heteropoly acids having general formula (II) can be used in hydrated form, or in alcoholic solution (for example, in ethanol, iso-propanol, or mixtures thereof).

In accordance with a preferred embodiment of the present invention, said heteropoly acids having general formula (I) and said heteropoly acids having general formula (II) can be selected, for example, from: phosphomolybdic acid hydrate {$H_3[P(MoO_3)_{12}O_4].nH_2O$}, phosphomolybdic acid {$H_3[P(MoO_3)_{12}O_4]$} in alcoholic solution, phosphotungstic acid hydrate {$H_3[P(WO_3)_{12}O_4].nH_2O$}, phosphotungstic acid in alcoholic solution {$H_3[P(WO_3)_{12}O_4]$}, silicomolybdic acid hydrate {$H_4[Si(MoO_3)_{12}O_4].nH_2O$}, silicomolybdic acid {$H_4[Si(MoO_3)_{12}O_4]$} in alcoholic solution, silicotungstic acid hydrate {$H_4[Si(WO_3)_{12}O_4].nH_2O$}, silicotungstic acid {$H_4[Si(WO_3)_{12}O_4]$} in alcoholic solution, phosphomolybdic vanadic acid hydrate {$H_3[P(Mo)_6(V)_6O_{40}].nH_2O$}, phosphomolybdic vanadic acid {$H_3[P(Mo)_6(V)_6O_{40}]$} in alcoholic solution, phosphomolybdic vanadic acid hydrate {$H_3[P(Mo)_{10}(V)_2O_{40}].nH_2O$}, phosphomolybdic vanadic acid {$H_3[P(Mo)_{10}(V)_2O_{40}]$} in alcoholic solution, or mixtures thereof. Phosphomolybdic acid hydrate {$H_3[P(MoO_3)_{12}O_4].nH_2O$}, phosphomolybdic acid {$H_3[P$ $(MoO_3)_{12}O_4]\}$ in alcoholic solution, silicotungstic acid hydrate $\{H_4[Si(WO_3)_{12}O_4].nH_2O\}$, are preferred.

Heteropoly acids having general formula (I) or (II) are commercially available.

In accordance with a preferred embodiment of the present invention, said at least one salt or complex of a transition metal belonging to group 5 or 6 of the Periodic Table of the Elements with an organic anion or with an organic ligand can be selected, for example, from: bis(acetylacetonato)dioxomolybdenum(VI) (Cas No. 17524-05-9), molybdenum (VI) dioxide bis(2,2,6,6-tetramethyl-3,5-heptanedionate) (Cas No. 34872-98-5), bis(tert-butylimido)(bis)(dimethylamino)molybdenum(VI) (Cas No. 923956-62-1), 2,6-di-iso-propylphenylimido-neophilidene molybdenum(VI) bis(tert-butoxide) (Cas No. 126949-65-3), 2,6-di-iso-propylphenylimidoneophilidene molybdenum(VI) bis(hexafluoro-tert-butoxide) ("Schrock's catalyst") (Cas No. 139220-25-0), adduct of 2,6-di-iso-propylphenylimidoneophylidene molybdenum(VI) bis(trifluoromethanesulfonate)-dimethoxyethane (Cas No. 126949-63-1), 2,6-di-iso-propylphenylimidoneophylidene-[racemic-BIPHEN] molybdenum(VI) ("rac-Schrock's-Hoveyda catalyst") (Cas No. 300344-02-9), 2,6-di-iso-propylphenylimidoneophylidene[R-(+)-BIPHEN]molybdenum(VI) ["(R) Schrock's-Hoveyda catalyst"] (Cas No. 329735-77-5), 2,6-di-iso-propylphenylimidoneophylidene [S—(−)BIPHEN]molybdenum(VI) ["(S) Schrock's-Hoveyda catalyst"] (Cas No. 205815-80-1), vanadium(V) oxytriisopropoxide (Cas No. 5588-84-1), vanadium(IV) oxide acetylacetonate (Cas No. 3153-26-2), acetylacetonate of vanadium(III), tetrakis(dimethylamino)vanadium(IV) (Cas No. 19824-56-7), tetrakis(diethylamino)vanadium(IV) (Cas No. 219852-96-7), or mixtures thereof. Bis(acetylacetonato)dioxomolybdenum (VI) (Cas No. 17524-05-9), vanadium(V) oxytriisopropoxide (Cas No. 5588-84-1), vanadium(IV) oxide acetylacetonate (Cas No. 3153-26-2), are preferred.

Salts of a transition metal belonging to group 5 or 6 of the Periodic Table of the Elements, with an organic anion, or with an organic ligand are available commercially.

In accordance with a preferred embodiment of the present invention, said alcohols can be selected, for example, from: methanol, ethanol, trifluoroethanol, n-propanol, iso-propanol, hexafluoro-iso-propanol, n-butanol, or mixtures thereof. iso-propanol, n-butanol, are preferred.

In accordance with a preferred embodiment of the present invention, said ketones can be selected, for example, from: cyclohexanone, acetone, methyl ethyl ketone, or mixtures thereof.

In accordance with a preferred embodiment of the present invention, said esters can be selected, for example, from: butyrolactone, ethyl acetate, propyl acetate, butyl acetate, ethyl butyrate, or mixtures thereof.

In accordance with a preferred embodiment of the present invention, said process can be carried out at a temperature ranging from 25° C. to the boiling point of the solvent used, and for a time ranging from 15 minutes to 8 hours, preferably ranging from 30 minutes to 5 hours.

It is to be noted that at the end of the process according to the present invention a hole transporting material is obtained in solution form, said solution having a pH ranging from 6 to 7.

The hole transporting material in solution form obtained at the end of the aforementioned process can be used for the formation of a buffer layer, in particular in the construction of photovoltaic devices (or solar devices), such as photovoltaic cells (or solar cells), photovoltaic modules (or solar modules), either on a rigid support, or on a flexible support. Furthermore, said hole transporting material can be advantageously used in the construction of Organic Light Emitting Diodes (OLEDs), or of Organic Field Effect Transistors (OFETs). In particular, said hole transporting material can be advantageously used in the construction of a polymer photovoltaic cell (or solar cell) with an inverted structure.

Therefore, the subject matter of the present invention is also a polymer photovoltaic cell (or solar cell) with an inverted structure comprising:

an anode;
an anode buffer layer;
an active layer comprising at least one photoactive organic polymer as the electron donor and at least one electron acceptor organic compound;
a cathode buffer layer;
a cathode;
wherein said anode buffer layer comprises the above-mentioned hole transporting material.

In accordance with a preferred embodiment of the present invention, said anode can be made of metal, said metal preferably being selected, for example, from silver (Ag), gold (Au), aluminum (Al); or it can be constituted by grids of conductive material, said conductive material preferably being selected, for example, from silver (Ag), copper (Cu), graphite, graphene, and by a transparent conductive polymer, said transparent conductive polymer preferably being selected from PEDOT:PSS [poly(3,4-ethylenedioxythiophene):poly(styrene sulfonate)], (PANI) (polyaniline); or it can be constituted by a metal nanowire-based ink, said metal preferably being selected, for example, from silver (Ag), copper (Cu).

Said anode can be obtained by depositing said metal onto the anode buffer layer through deposition techniques known in the state of the art, such as vacuum evaporation, flexographic printing, knife-over-edge-coating, spray-coating, screen-printing. Alternatively, said anode can be obtained through deposition of said transparent conductive polymer through spin coating, or gravure printing, or flexographic printing, or slot die coating, followed by deposition of said grids of conductive material through evaporation, or screen-printing, or spray-coating, or flexographic printing. Alternatively, said anode can be obtained through deposition of said metal nanowire-based ink through spin coating, or gravure printing, or flexographic printing, or slot die coating.

Said anode buffer layer can be obtained by depositing the hole transporting material in the form of solution obtained at the end of the process according to the present invention onto the active layer through deposition techniques known in the state of the art, such as vacuum evaporation, spin coating, drop casting, doctor blade casting, spin-coating, slot die coating, gravure printing, flexographic printing, knife-over-edge-coating, spray-coating, screen-printing, adjusting on a case-by-case basis the rheological parameters of said hole transporting material in solution form (for example, viscosity) based on the requirements of the deposition technique used.

It should also be underlined that the hole transporting material in solution form obtained at the end of the process according to the present invention can also be advantageously used as an anode buffer layer in conventional organic photovoltaic cells (or solar cells) in place of the anode buffer layer obtained from the aqueous suspension comprising PEDOT:PSS [poly(3,4-ethylenedioxythiophene):polystyrene sulfonate] which, as mentioned above, is usually used.

In accordance with a preferred embodiment of the present invention, said photoactive organic polymer can be selected, for example, from:

(a) polythiophenes such as, for example, poly(3-hexylthiophene) (P3HT) regioregular, poly(3-octylthiophene), poly(3,4-ethylenedioxythiophene), or mixtures thereof;

(b) conjugated alternating or statistical copolymers comprising:
at least one benzotriazole unit (B) having general formula (Ia) or (Ib):

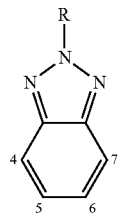

(Ia)

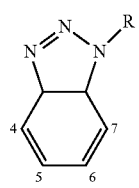

(Ib)

in which the group R is selected from alkyl groups, aryl groups, acyl groups, thioacyl groups, said alkyl, aryl, acyl and thioacyl groups being optionally substituted;
at least one conjugated structural unit (A), in which each unit (B) is connected to at least one unit (A) in any of positions 4, 5, 6, or 7, preferably in positions 4 or 7;

(c) conjugated alternating copolymers comprising benzothiadiazole units, such as, for example, PCDTBT {poly[N-9"-heptadecanyl-2,7-carbazole-alt-5,5-(4', 7'-di-2-thienyl-2',1',3'-benzothiadiazole]}, PCPDTBT {poly[2, 6-(4,4-bis-(2-ethylhexyl)-4H-cyclopenta [2,1-b; 3,4-b']-dithiophene)-alt-4,7-(2,1,3-benzotiadiazole)]};

(d) conjugated alternating copolymers comprising thieno [3,4-b]pyrazidine units;

(e) conjugated alternating copolymers comprising quinoxaline units;

(f) conjugated alternating copolymers comprising monomeric silica units, such as, for example, copolymers of 9,9-dialkyl-9-silafluorene;

(g) conjugated alternating copolymers comprising condensed thiophene units, such as, for example, copolymers of thieno[3,4-b]thiophene and benzo[1,2-b: 4,5-b']-dithiophene;

(h) conjugated alternating copolymers comprising benzothiadiazole or naphtothiadiazole units substituted with at least one fluorine atom and thiophene units substituted with at least one fluorine atom, such as, for example, PffBT4T-2OD {poly[(5,6-difluoro-2,1,3-benzothiadiazol-4,7-diyl)-aft-(3,3'''-di(2-octyldodecyl)-2, 2',5',2'';5'',2'''-quaterthiophene-5,5'''-diyl)]}, PBTff4T-2OD {poly[(2,1,3-benzothiadiazole-4,7-diyl)-alt-(4', 3'''-difluoro-3,3'''-(2-octyldodecyl)-2,2';5',2'';5'',2'''-quaterthiophene-5,5'''-diyl)]}, PNT4T-2OD {poly (naphtho[1,2-c:5,-c']bis [1,2,5] thiadiazole-5,10-diyl)-alt-(3,3'''-(2-octyldodecyl)-2,2';5',2'';5'', 2'''-quaterthiophene-5,5'''-diyl)];

(i) conjugated copolymers comprising thieno[3,4-c]pyrrole-4,6-dione units such as, for example, PBDTTPD {poly[[5-(2-ethylhexyl)-5,6-dihydro-4,6-dioxo-4H-thieno[3,4-c]pyrrole-1,3-diyl][4,8-bis:[(2-ethylhexyl)oxy]benzo.[1,2-b:4,5-b']dithiophene-2,6-diyl]};

(l) conjugated copolymers comprising thienothiophene units, such as, for example, PTB7 poly{({4,8-bis[(2-ethylhexyl)oxy]benzo[1,2-b:4,5-b'] dithiophene-2,6-diyl}{3-fluoro-2-[(2-ethylhexyl)carbonyl]thieno[3,4-b]thiophenediyl}};

(m) polymers comprising a derivative of indacen-4-one having general formula (III), (IV) or (V):

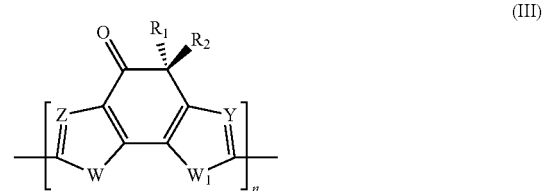

(III)

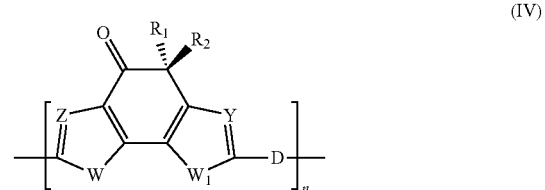

(IV)

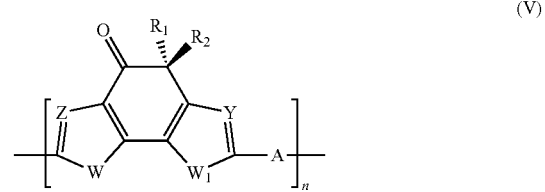

(V)

in which:

W and $W_1$, identical or different, preferably identical, represent an oxygen atom; a sulfur atom; an N—$R_3$ group wherein $R_3$ represents a hydrogen atom, or is selected from linear or branched $C_1$-$C_{20}$ alkyl groups, preferably $C_2$-$C_{10}$;

Z and Y, identical or different, preferably identical, represent a nitrogen atom; or a C—$R_4$ group in which $R_4$ represents a hydrogen atom, or is selected from linear or branched $C_1$-$C_{20}$ alkyl groups, preferably $C_2$-$C_{10}$, optionally substituted cycloalkyl groups, optionally substituted aryl groups, optionally substituted heteroaryl groups, linear or branched $C_1$-$C_{20}$ alkoxy groups, preferably $C_2$-$C_{10}$, $R_5$—O— [$CH_2$—$CH_2$—O]$_n$— polyethylenoxyl groups in which $R_5$ is selected from linear or branched $C_1$-$C_{20}$ alkyl groups, preferably $C_2$-$C_{10}$, and n is an integer ranging from 1 to 4, —$R_6$—O$R_7$ groups in which $R_6$ is selected from linear or branched $C_1$-$C_{20}$ alkyl groups, preferably $C_2$-$C_{10}$, and $R_7$ represents a hydrogen atom or is selected from linear or branched $C_1$-$C_{20}$ alkyl groups, preferably $C_2$-$C_{10}$, or is selected from $R_5$—[—$OCH_2$—$CH_2$-]$_n$— polyethylenoxyl groups in which $R_5$ has the same meanings reported above and n is an integer ranging from 1 to 4, —$COR_8$ groups wherein $R_8$ is selected from linear or branched $C_1$-$C_{20}$ alkyl groups, preferably $C_2$-$C_{10}$, —COOR$_9$ groups in which R$_9$ is selected from linear or branched C$_1$-C$_{20}$ alkyl groups, preferably C$_2$-C$_{10}$; or represent a —CHO group, or a cyano group (—CN);

R$_1$ and R$_2$, identical or different, preferably identical, are selected from linear or branched C$_1$-C$_{20}$ alkyl groups, preferably C$_2$-C$_{10}$; optionally substituted cycloalkyl groups; optionally substituted aryl groups; optionally substituted heteroaryl groups; linear or branched C$_1$-C$_{20}$ alkoxy groups, preferably C$_2$-C$_{10}$; R$_5$—O—[CH$_2$—CH$_2$—O]$_n$— polyethylenoxyl groups in which R$_5$ has the same meanings reported above and n is an integer ranging from 1 to 4; —R$_6$—OR$_7$ groups in which R$_6$ and R$_7$ have the same meanings reported above; —COR$_8$ groups in which R$_8$ has the same meanings reported above; or —COOR$_9$ groups in which R$_9$ has the same meanings reported above; or represent a —CHO group, or a cyano group (—CN);

D represents an electron-donor group;

A represents an electron acceptor group;

n is an integer ranging from 10 to 500, preferably ranging from 20 to 300.

More details on conjugated alternating or statistical copolymers (b) comprising at least one benzotriazole unit (B) and at least one conjugated structural unit (A) and on the process for their preparation can be found, for example, in international patent application WO 2010/046114 in the name of the Applicant.

More details on conjugated alternating copolymers comprising benzothiadiazole units (c), conjugated alternating copolymers comprising thieno[3,4-b]pyrazidine units (d), conjugated alternating copolymers comprising quinoxaline units (e), conjugated alternating copolymers comprising monomeric silica units (f), conjugated alternating copolymers comprising condensed thiophene units (g), can be found, for example, in Chen J. et al., "*Accounts of chemical research*" (2009), Vol. 42, No. 11, pag. 1709-1718; Po' R. et al., "*Macromolecules*" (2015), Vol. 48(3), pag. 453-461.

More details on conjugated alternating copolymers comprising benzothiadiazole or naphtothiadiazole units substituted with at least one fluorine atom and thiophene units substituted with at least one fluorine atom (h) can be found, for example, in Liu Y. et al., "*Nature Communications*" (2014), Vol. 5, Article no. 5293 (DOI:10.1038/ncomms6293). More details on conjugated copolymers comprising thieno[3,4-c]pyrrole-4,6-dione units (i) can be found, for example, in Pan H. et al., "*Chinese Chemical Letters*" (2016), Vol. 27, Issue 8, pag. 1277-1282.

More details on conjugated copolymers comprising thienothiophene units (I) can be found, for example, in Liang Y. et al., "*Journal of the American Chemical Society*" (2009), Vol. 131(22), pag. 7792-7799; Liang Y. et al., "*Accounts of Chemical Research*" (2010), Vol. 43(9), pag. 1227-1236.

More details on polymers comprising a derivative of indacen-4-one (q) can be found, for example, in Italian patent application MI2015A000676 in the name of the Applicant. In accordance with a particularly preferred embodiment of the present invention, said photoactive organic polymer can be selected, for example from: poly(3-hexylthiophene) (P3HT), PffBT4T-2OD {poly[(5,6-difluoro-2,1,3-benzothiadiazol-4,7-diyl)-alt-(3,3'''-di(2-octyldodecyl)-2,2',5',2'';5'',2'''-quaterthiophene-5,5'''-diyl)]}, PBDTTPD {poly[[5-(2-ethylhexyl)-5,6-dihydro-4,6-dioxo-4H-thieno[3,4-c]pyrrole-1,3-diyl] [4,8-bis[(2-ethylhexyl)oxy]benzo[1,2-b:4,5-b']dithiophene-2,6-diyl]}, PTB7 {poly ({4,8-bis[(2-ethylhexyl)oxo]benzo[1,2-b:4,5-b']dithiophene-2,6-diyl}{3-fluoro-2-[(2-ethylhexyll)carbonyl]thieno[3,4-b]thiophenediyl})}.

In accordance with a preferred embodiment of the present invention, said organic electron acceptor compound can be selected, for example, from fullerene derivatives such as, for example, [6,6]-phenyl-C$_{61}$-butyric acid methyl ester (PCBM), [6,6]-phenyl-C$_{71}$-butyric acid methyl ester (PC71BM), bis-adduct indene-C$_{60}$ (ICBA), bis(1-[3-(methoxycarbonyl)propyl]-1-phenyl)-[6,6]C62 (Bis-PCBM). [6,6]-phenyl-C$_{61}$-butyric acid methyl ester (PCBM), [6,6]-phenyl-C$_{71}$-butyric acid methyl ester (PC71BM) are preferred. In accordance with a further preferred embodiment of the present invention, said organic electron acceptor compound can be selected, for example, from non-fullerene compounds, optionally polymeric, such as, for example, compounds based on perylene-diimides or naphthalene-diimides and fused aromatic rings; indacenothiophene with terminal electron-poor groups; compounds having an aromatic core able to symmetrically rotate such as derivatives of corannulene or truxenone. 3,9-bis{2-methylene-[3-(1,1-dicyanomethylene)-indanone]}-5,5,11,11-tetrakis(4-hexylphenyl)-dithieno[2,3-d:2',3'-d']-s-indaceno[1,2-b:5,6-b']-dithiophene; poly {[N,N'-bis{2-octyldodecyl)-1,4,5,8-naftalenediimide-2,6-diyl]-alt-5,5'-(2,2'-bithiophene)}, are preferred.

More details on said non-fullerene compounds can be found, for example, in Nielsen C.

B. et al., "*Accounts of Chemical Research*" (2015), Vol. 48, pag. 2803-2812; Zhan C. et al., "*RSC Advances*" (2015), Vol. 5, pag. 93002-93026.

In accordance with a preferred embodiment of the present invention, said cathode buffer layer can comprise zinc oxide, indium oxide, tin oxide, cerium oxide, titanium oxide, preferably zinc oxide.

Said cathode buffer layer can be obtained by depositing a zinc oxide precursor solution on the cathode through deposition techniques known in the state of the art such as, for example, vacuum evaporation, spin coating, drop casting, doctor blade casting, slot die coating, gravure printing, flexographic printing, knife-over-edge-coating, spray-coating, screen-printing, adjusting on a case-by-case basis the rheological parameters of said hole transporting material in solution form (for example, viscosity) based on the requirements of the deposition technique used.

More details on the formation of said cathode buffer layer based on a zinc oxide precursor solution can be found, for example, in Pò R. et al., "*Energy & Environmental Science*" (2014), Vol. 7, pag. 925-943.

In accordance with a preferred embodiment of the present invention, said cathode can be made of a material selected, for example, from: indium tin oxide (ITO), tin oxide doped with fluorine (FTO), zinc oxide doped with aluminum (AZO), zinc oxide doped with gadolinium oxide (GZO); or it can be constituted by grids of conductive material, said conductive material being preferably selected, for example, from silver (Ag), copper (Cu), graphite, graphene, and by a transparent conductive polymer, said transparent conductive polymer preferably being selected, for example, from PEDOT:PSS [poly(3,4-ethylenedioxythiophene):poly(styrene sulfonate)], (PANI) (polyaniline); or it can be constituted by a metal nanowire-based ink, said metal preferably being selected, for example, from silver (Ag), copper (Cu).

Said cathode can be obtained by techniques known in the state of the art such as, for example, electron beam assisted deposition, sputtering. Alternatively, said cathode can be obtained through deposition of said transparent conductive polymer through spin coating, or gravure printing, or flexographic printing, or slot die coating, preceded by deposition of said grids of conductive material through evaporation, or screen-printing, or spray-coating, or flexographic printing. Alternatively, said cathode can be obtained through deposition of said metal nanowire-based ink through spin coating, or gravure printing, or flexographic printing or slot die coating.

In accordance with a preferred embodiment of the present invention, said cathode can be associated with a support layer that can be made of a rigid transparent material such as, for example, glass or of a flexible material such as, for example, polyethylene terephthalate (PET), polyethylene naphthalate (PEN), polyethyleneimine (PI), polycarbonate (PC), polypropylene (PP), polyimide (PI), triacetyl cellulose (TAC), or their copolymers.

As mentioned above, the anode, the cathode, the anode buffer layer and the cathode buffer layer in the aforementioned photovoltaic cell (or solar cell) can be deposited through techniques known in the state of the art: more details on said techniques can be found, for example, in: Pò R. et al., "*Interfacial Layers*, in "*Organic Solar Cells—Fundamentals, Devices, and Upscaling*" (2014), Chapter 4, Richter H. and Rand B. Eds., Pan Stanford Publishing Pte Ltd.; Yoo S. et al., "*Electrodes in Organic Photovoltaic Cells*, in "*Organic Solar Cells—Fundamentals, Devices, and Upscaling*" (2014), Chapter 5, Richter H. and Rand B. Eds., Pan Stanford Publishing Pte Ltd.; Angmo D. et al., "*Journal of Applied Polymer Science*" (2013), Vol. 129, Issue 1, pag. 1-14.

In accordance with a preferred embodiment of the present invention, the process for preparing the polymer photovoltaic cell (or solar cell) with an inverted structure comprises:
  forming the cathode through sputtering; or through electron beam assisted deposition; or through deposition of a conductive transparent polymer through spin coating, or gravure printing, or flexographic printing, or slot die coating, preceded by the deposition of grids of conductive material through evaporation, or screen-printing, or spray-coating, or flexographic printing; or through deposition of said metal nanowire-based ink through spin coating, or gravure printing, or flexographic printing, or slot die coating;
  forming the cathode buffer layer through spin coating, or gravure printing, or flexographic printing, or slot die coating;
  forming the active layer through spin coating, or gravure printing, or slot-die coating;
  forming the anode buffer layer through spin coating, or gravure printing, or screen-printing, or flexographic printing, or slot-die coating;
  forming the anode through vacuum evaporation, or screen-printing, or spray-coating, or flexographic printing; or through deposition of a conductive transparent polymer through spin coating, or gravure printing, or flexographic printing, or slot die coating, followed by deposition of grids of conductive material through evaporation, or screen-printing, or spray-coating, or flexographic printing; or through deposition of metal nanowire-based ink through spin coating, or gravure printing, or flexographic printing, or slot die coating.

In accordance with a preferred embodiment of the present invention, in the organic photovoltaic cell (or solar cell) with an inverted structure according to the present invention:
  the anode can have a thickness ranging from 50 nm to 150 nm, preferably ranging from 80 nm to 120 nm;
  the anode buffer layer can have a thickness ranging from 1 nm to 100 nm, preferably ranging from 2 nm to 40 nm;
  the active layer can have a thickness ranging from 50 nm to 500 nm, preferably ranging from 70 nm to 360 nm;
  the cathode buffer layer can have a thickness ranging from 10 nm to 100 nm, preferably ranging from 20 nm to 50 nm;
  the cathode can have a thickness ranging from 50 nm to 150 nm, preferably ranging from 80 nm to 100 nm.

The present invention will now be illustrated in more detail through an embodiment with reference to FIG. 1 provided below which represents a cross sectional view of a polymer photovoltaic cell (or solar cell) with an inverted structure according to the present invention.

With reference to FIG. 1, the polymer photovoltaic cell (or solar cell) with an inverted structure (1) comprises:
  a transparent support (7), for example a glass or plastic support;
  a cathode (2), for example an indium tin oxide (ITO) cathode; or a cathode obtained through deposition of a conductive transparent polymer through spin coating, or gravure printing, or flexographic printing, or slot die coating, preceded by deposition of grids of conductive material through evaporation, or screen-printing, or spray-coating, or flexographic printing; or a cathode obtained through deposition of metal nanowire-based ink through spin coating, or gravure printing, or flexographic printing, or slot die coating;
  a cathode buffer layer (3), comprising, for example, zinc oxide;
  a layer of photoactive material (4) comprising at least one photoactive organic polymer, for example, poly(3-hexylthiophene) (P3HT) regioregular, at least one non-functionalized fullerene, for example, PCBM;
  an anode buffer layer (5), comprising the hole transporting material according to the present invention, for example molybdenyl phosphomolybdate, vanadyl phosphomolybdate, vanadyl silicotungstate;
  an anode (6), for example a silver (Ag), or an anode obtained through deposition of a conductive transparent polymer through spin coating, or gravure printing, or flexographic printing, or slot die coating, followed by deposition of grids of conductive material through evaporation, or screen-printing, or spray-coating, or flexographic printing; or an anode obtained by deposition of metal nanowire-based ink through spin coating, or gravure printing, or flexographic printing, or slot die coating.

For the purpose of understanding the present invention better and to put it into practice, below are some illustrative and non-limiting examples thereof.

EXAMPLE 1

Preparation of Molybdenyl Phosphomolybdate in Iso-Propanol 260 mg of bis(acetylacetonato)dioxomolybdenum(VI) (Cas No. 17524-05-9) (Strem Chemicals) (0.797 mmoles) dissolved in 50 ml of iso-propanol (Aldrich) were placed in a 250 ml flask: the suspension thus obtained was heated to 80° C. Subsequently, 998 mg of phosphomolybdic acid trihydrate (Aldrich) (0.531 mmoles) dissolved in 50 ml of iso-propanol (Aldrich) were added: the mixture thus obtained was kept at 80° C., for 3 hours, obtaining a very intense emerald green solution. The solution obtained was cooled to ambient temperature (25° C.) and transferred into a glass vessel with a plug: one drop of said solution was placed on a strip of wet litmus paper to measure the pH, which was equal to about 6-7.

EXAMPLE 2

Preparation of Molybdenyl Phosphomolybdate in n-Butanol 256 mg of bis(acetylacetonato)dioxomolybdenum(VI) (Cas No. 17524-05-9) (Strem Chemicals) (0.785 mmoles) dissolved in 30 ml of n-butanol (Carlo Erba) were placed in a 250 ml flask: the suspension thus obtained was heated to 90° C. Subsequently, 984 mg of phosphomolybdic acid trihydrate (Aldrich) (0.523 mmoles) dissolved in 20 ml of n-butanol (Carlo Erba) were added: the mixture thus obtained was kept at 95° C., for 2 hours, obtaining a very intense emerald green solution. The solution obtained was cooled to ambient temperature (25° C.) and transferred into a glass vessel with a plug: one drop of said solution was placed on a strip of wet litmus paper to measure the pH, which was equal to about 6-7.

EXAMPLE 3

Preparation of Vanadyl Phosphomolybdate in Iso-Propanol 211 mg of vanadium(IV) oxide acetylacetonate (Cas No. 3153-26-2) (Strem Chemicals) (0.797 mmoles) dissolved in 20 ml of iso-propanol (Aldrich) were placed in a 250 ml flask and, subsequently 4.845 g of a 20% by weight solution of phosphomolybdic acid in ethanol (Aldrich) (0.531 mmoles) and 65 ml of iso-propanol (Aldrich) were added: the mixture obtained was heated to 65° C., for 2.5 hours, gradually obtaining a dark blue-green solution which, after 24 hours, gradually turns pale yellow. The solution obtained was cooled to ambient temperature (25° C.) and transferred into a glass vessel with a plug: one drop of said solution was placed on a strip of wet litmus paper to measure the pH, which was equal to about 6-7.

EXAMPLE 4

Preparation of Vanadyl Silicotungstate in Iso-Propanol 1.14 g of silicotungstic acid hydrate (Fluka) (0.531 mmoles) dissolved in 20 ml of iso-propanol (Aldrich) were placed in a 250 ml flask and, subsequently, 116 g of vanadium(V) oxytriisopropoxide (Cas No. 5588-84-1) (Aldrich) (0.475 mmoles) dissolved in 60 ml of iso-propanol (Aldrich) were added: the mixture obtained was heated to 70° C., for 3 hours, obtaining a colorless solution. The solution obtained was cooled to ambient temperature (25° C.) and transferred into a glass vessel with a plug: one drop of said solution was placed on a strip of wet litmus paper to measure the pH, which was equal to about 6-7.

EXAMPLE 5 (COMPARATIVE)

Solar Cell with P3HT:PCBM and Molybdenum Oxide ($MoO_3$)

A polymer-based device was prepared on a glass substrate coated with ITO (indium tin oxide) (Kintec Company—Hong Kong), previously subjected to a cleaning process consisting of manual cleaning, rubbing with a lint-free cloth soaked in a detergent diluted with tap water. The substrate was then rinsed with tap water. Subsequently, the substrate was cleaned thoroughly through the following methods in sequence: ultrasonic baths in (i) distilled water plus detergent (followed by manual cleaning with a lint-free cloth); (ii) distilled water [followed by manual cleaning with a lint-free cloth]; (iii) acetone (Aldrich) and (iv) iso-propanol (Aldrich) in sequence. In particular, the substrate was arranged in a beaker containing the solvent, placed in an ultrasonic bath at 40° C., for a 10 minute treatment. After treatments (iii) and (iv), the substrate was dried with a compressed nitrogen stream.

Subsequently, the glass/ITO was cleaned further in an air-plasma device (Tucano type —Gambetti), straight before proceeding to the next step.

The substrate thus treated was ready for the deposition of the cathode buffer layer. For that purpose, the zinc oxide buffer layer was obtained starting from a 0.162 M solution of the complex [$Zn^{2+}$]-ethanolamine (Aldrich) in butanol (Aldrich). The solution was deposited through rotation on the substrate, operating at a rotation speed equal to 600 rpm (acceleration equal to 300 rpm/s), for 2 minutes and 30 seconds, and subsequently to a rotation speed equal to 1500 rpm, for 5 seconds. Immediately after the deposition of the cathode buffer layer, the formation of zinc oxide was obtained by thermally treating the device at 140° C., for 5 minutes, on a hot plate in ambient air. The cathode buffer layer thus obtained had a thickness of 30 nm and was partially removed from the surface with 0.1 M acetic acid (Aldrich), leaving the layer only on the desired surface.

The active layer, comprising poly(3-hexylthiophene) (P3HT) regioregular (P3HT) (Plexcore OS) and [6,6]-phenyl-$C_{61}$-butyric acid methyl ester (PCBM) (Aldrich), was deposited through spin coating of a 1:0.8 (v:v) solution in chlorobenzene with a concentration of P3HT equal to 10 mg/ml, operating at a rotation speed of 300 rpm (acceleration equal to 150 rpm/s), for 90 seconds. The thickness of the active layer was 250 nm.

The anode buffer layer was deposited onto the active layer thus obtained, the buffer layer being obtained by depositing molybdenum oxide ($MoO_3$) (Aldrich) through a heat process. The thickness of the anode buffer layer was 10 nm. The silver (Ag) anode was deposited onto the anode buffer layer, the anode having a thickness of 100 nm, through vacuum evaporation, appropriately masking the area of the device so as to obtain an active area of 0.25 $mm^2$.

The depositions of the anode buffer layer and the anode were carried out in a standard vacuum evaporation chamber containing the substrate and two evaporation vessels equipped with a heating element containing 10 mg of molybdenum oxide ($MoO_3$) in powder and 10 shots of silver (Ag) (diameter 1 mm-3 mm) (Aldrich), respectively. The evaporation process was carried out under vacuum, at a pressure of about $1 \times 10^{-6}$ bar. The molybdenum oxide ($MoO_3$) and silver (Ag), after evaporation, were condensed in the non-masked parts of the device.

The thicknesses were measured with a Dektak 150 profilometer (Veeco Instruments Inc.).

The electrical characterization of the device obtained was carried out in a (nitrogen) controlled atmosphere in a glove box at ambient temperature (25° C.). The current-voltage curves (I-V) were acquired with a Keithley® 2600A multimeter connected to a PC for data collection. The photocurrent was measured by exposing the device to the light of an ABET SUN® 2000-4 solar simulator, able to provide AM

EXAMPLE 6 (COMPARATIVE)

Solar Cell with P3HT:PCBM and PEDOT:PSS

A polymer-based device was prepared on a glass substrate coated with ITO (indium tin oxide) (Kintec Company-Hong Kong), previously subjected to a cleaning process operating as described in Example 5.

The deposition of the cathode buffer layer and the deposition of the active layer were carried out as described in Example 5; the composition of said cathode buffer layer and the composition of said active layer are the same as those reported in Example 5; the thickness of said cathode buffer layer and the thickness of said active layer are the same as those reported in Example 5.

The anode buffer layer was deposited onto the active layer obtained through spin coating starting from a suspension comprising PEDOT:PSS [poly(3,4-ethylenedioxythiophene):poly(styrene sulfonate] (Clevios CPP105D-Heraeus Co.) with a concentration of PEDOT:PSS equal to 1.2 mg/ml, operating at a rotation speed of 3000 rpm (acceleration equal to 1500 rpm/s), for 90 seconds: straight after the deposition of the anode buffer layer, the device was treated at 120° C., for 3 minutes, on a hot plate in ambient air. The thickness of the anode buffer layer was 30 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 7 (INVENTION)

Solar Cell with P3HT:PCBM and Molybdenyl Phosphomolybdate

A polymer-based device was prepared on a glass substrate coated with ITO (indium tin oxide) (Kintec Company-Hong Kong), previously subjected to a cleaning process operating as described in Example 5.

The deposition of the cathode buffer layer and the deposition of the active layer were carried out as described in Example 5; the composition of said cathode buffer layer and the composition of said active layer are the same as that reported in Example 5; the thickness of said cathode buffer layer and the thickness of said active layer are the same as those reported in Example 5.

The anode buffer layer was deposited onto the active layer obtained through spin coating starting from the molybdenyl phosphmolybdate solution in n-butanol obtained as described in Example 2, further diluted 1:1 (v:v) with iso-propanol (Aldrich), operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 8 (COMPARATIVE)

Solar Cell with PffBT4T-2OD:$PC_{71}BM$ and PEDOT:PSS

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The active layer, comprising PffBT4T-2OD {poly[(5,6-difluoro-2,1,3-benzothiadiazole-4,7-diil)-alt-(3,3'''-di(2-octyldodecyl)-2,2';5',2'';5'',2'''-quaterthiophene-5,5'''-diyl)]} (Solarmer Inc.) and [6,6]-phenyl-$C_{71}$-butyric acid methyl ester ($PC_{71}BM$) (mixture of isomers —Aldrich), was deposited through spin coating starting from a 1:1.2 (v:v) solution in a chlorobenzene-o-dichlorobenzene 1:1 (v:v) mixture with a concentration of PffBT4T-2OD equal to 10 mg/ml, operating at a rotation speed of 500 rpm (acceleration equal to 250 rpm/s), for 120 seconds, and subsequently at a rotation speed of 1000 rpm (acceleration equal to 500 rpm/s), for 5 seconds. The thickness of the active layer was 350 nm. The deposition of the anode buffer layer was carried out as described in Example 6; the composition of said anode buffer layer is the same as that reported in Example 6; the thickness of said anode buffer layer is the same as that reported in Example 6.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 9 (COMPARATIVE)

Solar Cell with PffBT4T-2OD:$PC_{71}BM$ and phosphomolybdic acid

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 8; the composition of said active layer is the same as that reported in Example 8; the thickness of said active layer is the same as that reported in Example 8.

The anode buffer layer was deposited onto the active layer thus obtained through spin coating starting from a 0.25% by weight solution of phosphomolybdic acid in iso-propanol (Aldrich), further diluted 1:1 (v:v) with iso-propanol (Aldrich), operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 10 (INVENTION)

Solar Cell with PFFBT4T-2OD:PCBM and Molybdenyl Phosphomolybdate

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 8; the composition of said active layer is the same as that reported in Example 8; the thickness of said active layer is the same as that reported in Example 8.

The anode buffer layer was deposited onto the active layer obtained through spin coating starting from the molybdenyl phosphmolybdate solution in n-butanol obtained as described in Example 2, further diluted 1:1 (v:v) with iso-propanol (Aldrich), operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 11 (COMPARATIVE)

Solar Cell with PBDTTPD:PCBM and PEDOT:PSS

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The active layer, comprising PBDTTPD {{poly[[5-(2-ethylhexyl)-5,6-dihydro-4,6-dioxo-4H-thieno[3,4-c]pyrrole-1,3-diyl][4,8-bis[(2-ethylhexyl)oxy]benzo[1,2-b:4,5-b']dithiophene-2,6-diyl]} (1-Material Inc.) and [6,6]-phenyl-$C_{61}$-butyric acid methyl ester (PCBM) (Aldrich), was deposited through spin coating starting from a 1:1 (v:v) solution in o-xylene with a concentration of PBDTTPD equal to 9 mg/ml, operating at a rotation speed of 900 rpm (acceleration equal to 450 rpm/s), for 90 seconds. The thickness of the active layer was 100 nm.

The deposition of the anode buffer layer was carried out as described in Example 6; the composition of said anode buffer layer is the same as that reported in Example 6; the thickness of said anode buffer layer is the same as that reported in Example 6.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 12 (COMPARATIVE)

Solar Cell with PBDTTPD:PCBM and Vanadium(V) Oxytriisopropoxide

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 11; the composition of said active layer is the same as that reported in Example 11; the thickness of said active layer is the same as that reported in Example 11.

The anode buffer layer was deposited onto the active layer thus obtained, the buffer layer being obtained through spin coating starting from a solution of vanadium(V) oxytriisopropoxide (Cas No. 5588-84-1) (Strem) in iso-propanol (Aldrich) at a concentration of 6.9 mg/ml, operating at a rotation speed of 5000 rpm (acceleration equal to 2500 rpm/s), for 30 seconds: straight after the deposition of the anode buffer layer, the device was treated at 120° C., for 1 minute, on a hot plate in ambient air.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 13 (INVENTION)

Solar Cell with PBDTTPD:PCBM and Molybdenyl Phosphomolybdate

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 11; the composition of said active layer is the same as that reported in Example 11; the thickness of said active layer is the same as that reported in Example 11.

The anode buffer layer was deposited onto the active layer obtained through spin coating starting from the molybdenyl phosphmolybdate solution in n-butanol obtained as described in Example 2, further diluted 1:1 (v:v) with iso-propanol (Aldrich), operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 14 (COMPARATIVE)

Solar Cell with Ptb7 and PEDOT:PSS

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The active layer, comprising PTB7 {poly({4,8-bis[(2-ethylhexyl)-oxy]benzo[1,2-b:4,5-b']dithiophene-2,6-diyl}{3-fluoro-2-[(2-ethylhexyl)-carbonyl]-thieno[3,4-b]thiophenediyl})}(Aldrich) and [6,6]-phenyl-$C_{71}$-butyric acid methyl ester ($PC_{71}BM$) (Aldrich), was deposited through spin coating starting from a 1:1.5 (v:v) solution in chlorobenzene with a concentration of PTB7 equal to 10 mg/ml, operating at a rotation speed of 2000 rpm (acceleration equal to 1000 rpm/s), for 90 seconds. The thickness of the active layer was 95 nm.

The deposition of the anode buffer layer was carried out as described in Example 6; the composition of said anode buffer layer is the same as that reported in Example 6; the thickness of said anode buffer layer is the same as that reported in Example 6.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values.

EXAMPLE 15 (INVENTION)

Solar Cell with PTB7 and Vanadyl Phosphomolybdate

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 14; the composition of said active layer is the same as that reported in Example 14; the thickness of said active layer is the same as that reported in Example 14.

The anode buffer layer was deposited onto the active layer obtained through spin coating starting from the vanadyl phosphmolybdate solution in iso-propanol obtained as described in Example 3, operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values. Said characterizations were repeated 1 month after the solar cell had been manufactured. The mean values obtained are reported in Table 1.

EXAMPLE 16 (INVENTION)

Solar Cell with PTB7 and Vanadyl Silicotungstate

A polymer-based device was prepared on a glass substrate coated with ITO (indium tin oxide) (Kintec Company-Hong Kong), previously subjected to a cleaning process operating as described in Example 5.

The deposition of the cathode buffer layer was carried out as described in Example 5; the composition of said cathode buffer layer is the same as that reported in Example 5; the thickness of said cathode buffer layer is the same as that reported in Example 5.

The deposition of the active layer was carried out as described in Example 14; the composition of said active layer is the same as that reported in Example 14; the thickness of said active layer is the same as that reported in Example 14.

The anode buffer layer was deposited onto the active layer obtained through spin coating starting from the vanadyl silicotungstate solution in iso-propanol obtained as described in Example 3, operating at a rotation speed of 5000 rpm (acceleration equal to 2500 rpm/s), for 30 seconds. The thickness of the anode buffer layer was 10 nm.

The deposition of the silver (Ag) anode was carried out as described in Example 5: the thickness of said silver anode is the same as that reported in Example 5.

The thicknesses were measured with a Dektak 150 profilometer (Veeco Instruments Inc.).

The electrical characterization of the device, the current-voltage curves (I-V) and the photocurrent, was measured as described in Example 5. Table 1 shows the characteristic parameters as mean values. Said characterizations were repeated 1 month after the solar cell had been manufactured: the mean values obtained are reported in Table 1.

TABLE 1

| Example | FF[1] | Voc[2] (mV) | Jsc[3] (mA/cm$^2$) | η[4] (%) |
|---|---|---|---|---|
| 5 (comparative) | 0.61 | 0.57 | 8.23 | 2.86 |
| 6 (comparative) | 0.48 | 0.56 | 8.52 | 2.33 |
| 7 (invention) | 0.58 | 0.59 | 9.16 | 3.12 |
| 8 (comparative) | 0.31 | 0.60 | 10.22 | 1.92 |
| 9 (comparative) | 0.44 | 0.62 | 12.48 | 3.39 |
| 10 (invention) | 0.49 | 0.68 | 12.56 | 4.18 |
| 11 (comparative) | 0.38 | 0.55 | 2.67 | 0.57 |
| 12 (comparative) | 0.44 | 0.72 | 2.64 | 0.84 |
| 13 (invention) | 0.47 | 0.64 | 7.40 | 2.22 |
| 14 (comparative) | 0.30 | 0.47 | 6.95 | 1.00 |
| 15 (invention) | 0.47 | 0.66 | 11.65 | 3.68 |
| 15 (invention) (after 1 month) | 0.52 | 0.70 | 10.60 | 3.85 |
| 16 (invention) | 0.53 | 0.53 | 11.88 | 3.36 |
| 16 (invention) (after 1 month) | 0.50 | 0.59 | 11.75 | 3.48 |

[1]fill factor;
[2]open circuit voltage;
[3]short-circuit photocurrent density;
[4]photoelectric conversion efficiency.

From the data reported in Table 1 it can be deduced that:
- the solar cell having an anode buffer layer comprising molybdenyl phosphomolybdate in accordance with the present invention [Example 7 (invention)], has comparable if not higher performance levels, in particular in terms of photoelectric conversion efficiency (j), with respect to those of solar cells having an anode buffer layer comprising molybdenum oxide [Example 5 (comparative)] or PEDOT:PSS [Example 6 (comparative)];
- the solar cell having an anode buffer layer comprising molybdenyl phosphomolybdate in accordance with the present invention [Example 10 (invention)], has comparable if not higher performance levels, in particular in terms of photoelectric conversion efficiency (n), with respect to those of solar cells having an anode buffer layer comprising PEDOT:PSS [Example 8 (comparative)] or phosphomolybdic acid [Example 9 (comparative)];
- the solar cell having an anode buffer layer comprising molybdenyl phosphomolybdate in accordance with the present invention [Example 13 (invention)], has comparable if not higher performance levels, in particular in terms of photoelectric conversion efficiency (rl), with respect to those of solar cells having an anode buffer layer comprising PEDOT:PSS [Example 11 (comparative)] or vanadium(V) oxytriisopropoxide [Example 12 (comparative)];
- the solar cell having an anode buffer layer comprising molybdenyl phosphomolybdate in accordance with the present invention [Example 15 (invention)], has comparable if not higher performance levels, which remain stable 1 month after the manufacturing of the solar cell, in particular in terms of photoelectric conversion efficiency (rl), with respect to those of solar cells having an anode buffer layer comprising PEDOT:PSS [Example 14 (comparative)];
- the solar cell having an anode buffer layer comprising vanadyl silicotungstate in accordance with the present invention [Example 16 (invention)], has good performance levels, which remain stable 1 month after the manufacturing of the solar cell.

The invention claimed is:

1. Hole transporting material obtained by reacting:
   at least one heteropoly acid containing at least one transition metal belonging to group 5 or 6 of the Periodic Table of the Elements; with
   an equivalent amount of at least one salt or one complex of a transition metal belonging to group 5 or 6 of the Periodic Table of the Elements with an organic anion, or with an organic ligand;
   in the presence of at least one organic solvent selected from alcohols, ketones, esters; wherein said process is carried out at a temperature ranging from 25° C. to the boiling point of the solvent used, and for a time ranging from 15 minutes to 8 hours.

2. Hole transporting material according to claim 1, wherein said heteropoly acid is selected from heteropoly acids having general formula (I):

$$H_x[A(MO_3)_yO_z]  \quad (I)$$

in which:
A represents a silicon atom, or a phosphorus atom;
M represents an atom of a transition metal belonging to group 5 or 6 of the Periodic Table of the Elements;
x is an integer that depends on the valence of A;
y is 12 or 18;
z is 4 or 6.

3. Hole transporting material according to claim 1, wherein said heteropoly acid is selected from heteropoly acids having general formula (II):

$$H_x[A(Mo)_p(V)_qO_{40}]  \quad (II)$$

in which:
A represents a silicon atom, or a phosphorus atom;
x is an integer that depends on the valence of A;
p is 6 or 10;
q is 2 or 6.

4. Hole transporting material according to claim 2, wherein said heteropoly acids having general formula (I) and said heteropoly acids having general formula (II) are selected from: phosphomolybdic acid hydrate {H$_3$[P(MoO$_3$)$_{12}$O$_4$].nH$_2$O}, phosphomolybdic acid in alcoholic solution {H$_3$[P(MoO$_3$)$_{12}$O$_4$]}, phosphotungstic acid hydrate {H$_3$[P(WO$_3$)$_{12}$O$_4$].nH$_2$O}, phosphotungstic acid in alcoholic solution {H$_3$[P(WO$_3$)$_{12}$O$_4$]}, silicomolybdic acid hydrate {H$_4$[Si(MoO$_3$)$_{12}$O$_4$].nH$_2$O}, silicomolybdic acid in alcoholic solution {H$_4$[Si(MoO$_3$)$_{12}$O$_4$]}, silicotungstic acid hydrate {H$_4$[Si(WO$_3$)$_{12}$O$_4$].nH$_2$O}, silicotungstic acid in alcoholic solution {H$_4$[Si(WO$_3$)$_{12}$O$_4$]}, phosphomolybdic vanadic acid hydrate H$_3$[P(Mo)$_6$(V)$_6$O$_{40}$].nH$_2$O}, phosphomolybdic vanadic acid in alcoholic solution {H$_3$[P(Mo)$_6$(V)$_6$O$_{40}$]}, phosphomolybdic vanadic acid hydrate {H$_3$[P(Mo)$_{10}$(V)$_2$O$_{40}$].nH$_2$O }, phosphomolybdic vanadic acid in alcoholic solution {H$_3$[P(Mo)$_{10}$(V)$_2$O$_{40}$]}, and mixtures thereof.

5. Hole transporting material according to claim 1, wherein said at least one salt or a complex of a transition metal belonging to group 5 or 6 of the Periodic Table of the Elements with an organic anion, or with an organic ligand, is selected from: bis(acetylacetonato)dioxomolybdenum (VI) (Cas No. 17524-05-9), molybdenum(VI) dioxide bis(2,2,6,6-tetramethyl-3,5-heptanedionate) (Cas No. 34872-98-5), bis(tert-butylimido)(bis)(dimethylamino)molybdenum (VI) (Cas No. 923956-62-1), 2,6-di-iso-propylphenylimidoneophilidene molybdenum(VI) bis(tert-butoxide) (Cas No. 126949-65-3), 2,6-di-iso-propylphenylimidoneophilidene molybdenum(VI) bis(hexafluoro-tert-butoxide) ("Schrock's catalyst") (Cas No. 139220-25-0), adduct of 2,6-di-iso-propylphenylimidoneophylidene molybdenum(VI) bis(trifluoromethanesulfonate)-dimethoxyethane (Cas No. 126949-63-1), 2,6-di-iso-propylphenylimidoneophylidene-[racemic-BIPHEN] molybdenum(VI) ("rac-Schrock's-Hoveyda catalyst") (Cas No. 300344-02-9), 2,6-di-iso-propylphenylimidoneophylidene[R-(+)-BIPHEN] molybdenum(VI) ["(R) Schrock's-Hoveyda catalyst"] (Cas No. 329735-77-5), 2,6-di-iso-propylphenylimidoneophylidene [S—(–) BIPHEN]molybdenum(VI) ["(S) Schrock's-Hoveyda catalyst"] (Cas No. 205815-80-1), vanadium(V) oxytriisopropoxide (Cas No. 5588-84-1), vanadium (IV) oxide acetylacetonate (Cas No. 3153-26-2), acetylacetonate of vanadium(III), tetrakis(dimethylamino) vanadium(IV) (Cas No. 19824-56-7), tetrakis (diethylamino)vanadium(IV) (Cas No. 219852-96-7), and mixtures thereof.

6. Hole transporting material according to claim 1, wherein the organic solvent is an alcohol selected from: methanol, ethanol, trifluoroethanol, n-propanol, iso-propanol, hexafluoro-iso-propanol, n-butanol, and mixtures thereof.

7. Hole transporting material according to claim 1, wherein the organic solvent is a ketone selected from: cyclohexanone, acetone, methyl ethyl ketone, and mixtures thereof.

8. Hole transporting material according to claim 1, in which the organic solvent is an ester selected from: butyrolactone, ethyl acetate, propyl acetate, butyl acetate, ethyl butyrate, and mixtures thereof.

9. Polymer photovoltaic cell (or solar cell) with an inverted structure comprising:
an anode;
an anode buffer layer;
an active layer comprising at least one photoactive organic polymer as the electron donor and at least one electron acceptor organic compound;
a cathode buffer layer;
a cathode;
wherein said anode buffer layer comprises the hole transporting material of claim 1.

10. Polymer photovoltaic cell (or solar cell) with an inverted structure according to claim 9, wherein said anode is made of metal or is constituted by grids of conductive material and by a transparent conductive polymer or is constituted by a metal nanowire-based ink.

11. Polymer photovoltaic cell (or solar cell) with an inverted structure according to claim 9, wherein said photoactive organic polymer is selected from:
(a) polythiophenes;
(b) conjugated alternating or statistical copolymers comprising:
at least one benzotriazole unit (B) having general formula (Ia) or (Ib):

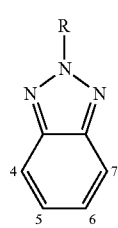

(Ia)

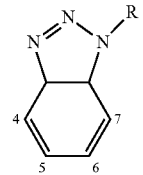

(Ib)

in which group R is selected from alkyl groups, aryl groups, acyl groups, thioacyl groups, said alkyl, aryl, acyl and thioacyl groups being optionally substituted; at least one conjugated structural unit (A), in which each unit (B) is connected to at least one unit (A) in any of positions 4, 5, 6, or 7;
(c) conjugated alternating copolymers comprising benzothiadiazole units;
(d) conjugated alternating copolymers comprising thieno[3,4-b]pyrazidine units;
(e) conjugated alternating copolymers comprising quinoxaline units;
(f) conjugated alternating copolymers comprising monomeric silica units;
(g) conjugated alternating copolymers comprising condensed thiophene units;
(h) conjugated alternating copolymers comprising benzothiadiazole or naphthothiadiazole units substituted with at least one fluorine atom and thiophene units substituted with at least one fluorine atom;
(i) conjugated copolymers comprising thieno [3,4-c]pyrrole-4,6-dione units;
(l) conjugated copolymers comprising thienothiophene units;
(m) polymers comprising a derivative of indacen-4-one having general formula (III), (IV) or (V):

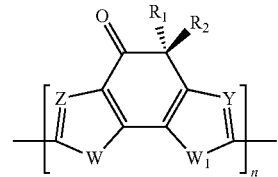

(III)

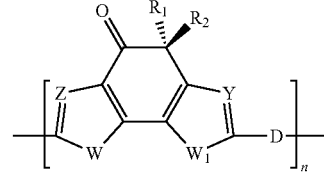

(IV)

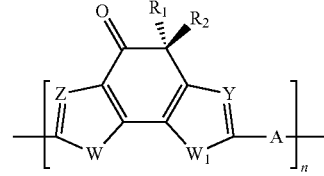

(V)

in which:
W and $W_1$, identical or different, represent an oxygen atom; a sulfur atom; an N—$R_3$ group wherein $R_3$ represents a hydrogen atom, or is selected from linear or branched $C_1$-$C_{20}$ alkyl groups;

Z and Y, identical or different, represent a nitrogen atom; or a C—$R_4$ group in which $R_4$ represents a hydrogen atom, or is selected from linear or branched $C_1$-$C_{20}$ alkyl groups, optionally substituted cycloalkyl groups, optionally substituted aryl groups, optionally substituted heteroaryl groups, linear or branched, $C_1$-$C_{20}$ alkoxy groups, $R_5$—O—[$CH_2$—$CH_2$—O]$_n$-polyethylenoxyl groups in which $R_5$ is selected from linear or branched $C_1$-$C_{20}$ alkyl groups, and n is an integer ranging from 1 to 4, —$R_6$—$OR_7$ groups in which $R_6$ is selected from linear or branched $C_1$-$C_{20}$ alkyl groups, and $R_7$ represents a hydrogen atom or is selected from linear or branched $C_1$-$C_{20}$ alkyl groups, or is selected from polyethylenoxyl groups $R_5$-[$OCH_2$—$CH_2$—]$_n$— in which $R_5$ has the same meanings reported above and n is an integer ranging from 1 to 4, —$COR_8$ groups wherein $R_8$ is selected from linear or branched $C_1$-$C_{20}$ alkyl groups, —$COOR_9$ groups in which $R_9$ is selected from linear or branched $C_1$-$C_{20}$ alkyl groups, or represent a —CHO group, or a cyano group (—CN);

$R_1$ and $R_2$, identical or different, are selected from linear or branched $C_1$-$C_{20}$ alkyl groups; optionally substituted cycloalkyl groups; optionally substituted aryl groups; optionally substituted heteroaryl groups; linear or branched $C_1$-$C_{20}$ alkoxy groups; $R_5$—O—$CH_2$—$CH_2$—O]$_n$— polyethylenoxyl groups—in which $R_5$ has the same meanings reported above and n is an integer ranging from 1 to 4; —$R_6$—$OR_7$ groups in which $R_6$ and $R_7$ have the same meanings reported above; —$COR_8$ groups in which $R_8$ has the same meanings reported above; or —$COOR_9$ groups in which R9 has the same meanings reported above; or represent a —CHO group, or a cyano group (—CN);

D represents an electron-donor group;
A represents an electron acceptor group;
n is an integer comprised from 10 to 500.

12. Polymer photovoltaic cell (or solar cell) with an inverted structure according to claim 9, wherein said organic electron acceptor compound is selected from derivatives of the fullerene.

13. Polymer photovoltaic cell (or solar cell) with an inverted structure according to claim 9, wherein said organic electron acceptor compound is selected from non-fullerene compounds, optionally polymeric; indacenothiophene with terminal electron-poor groups; compounds having an aromatic core able to symmetrically rotate.

14. Polymer photovoltaic cell (or solar cell) with an inverted structure according to claim 9, wherein said cathode buffer layer comprises zinc oxide, indium oxide, tin oxide, cerium oxide, or titanium oxide.

15. Polymer photovoltaic cell (or solar cell) with an inverted structure according to claim 9, wherein said cathode is made of a material selected from: indium tin oxide (ITO), tin oxide doped with fluorine (FTO), zinc oxide doped with aluminum (AZO), zinc oxide doped with gadolinium oxide (GZO); or is constituted by grids of conductive material, said conductive material being selected from silver (Ag), copper (Cu), graphite, graphene, and by a transparent conductive polymer, said conductive transparent polymer being selected from PEDOT: PSS [poly(3,4-ethylenediossithiophene): poly(styrene sulfonate)], (PEDOT:PANI) [poly(3, 4-ethylenediossithiophene); polyaniline]; or it is constituted by a metal nanowire-based ink, said metal being selected from silver (Ag), and copper (Cu).

16. Polymer photovoltaic cell (or solar cell) with an inverted structure according to claim 9, wherein said cathode is associated with a support layer made of a rigid transparent material or of a flexible material selected from polyethylene terephthalate (PET), polyethylene naphthalate (PEN), polyethyleneimine (PI), polycarbonate (PC), polypropylene (PP), polyimide (PI), triacetyl cellulose (TAC), or their copolymers.

17. Process for the preparation of a polymer photovoltaic cell (or solar cell) with an inverted structure according to claim 9, comprising:
    forming the cathode through sputtering; or through electron beam assisted deposition;
    or through deposition of a conductive transparent polymer through spin coating, or gravure printing, or flexographic printing, or slot die coating, preceded by the deposition of grids of conductive material through evaporation, or screen-printing, or spray-coating, or flexographic printing; or through deposition of said metal nanowire-based ink through spin coating, or gravure printing, or flexographic printing, or slot die coating;
    forming the cathode buffer layer through spin coating, or gravure printing, or flexographic printing, or slot die coating;
    forming the active layer through spin coating, or gravure printing, or slot-die coating;
    forming the anode buffer layer through spin coating, or gravure printing, or screen-printing, or flexographic printing, or slot-die coating;
    forming the anode through vacuum evaporation, or screen-printing, or spray-coating, or flexographic printing; or through deposition of a conductive transparent polymer through spin coating, or gravure printing, or flexographic printing, or slot die coating, followed by deposition of grids of conductive material through evaporation, or screen-printing, or spray-coating, or flexographic printing; or through deposition of metal nanowire-based ink through spin coating, or gravure printing, or flexographic printing, or slot die coating.

18. Polymer photovoltaic cell (or solar cell) with an inverted structure according to claim 9 wherein:
    the anode has a thickness ranging from 50 nm to 150 nm;
    the anode buffer layer has a thickness ranging from 1 nm to 100 nm;
    the active layer has a thickness ranging from 50 nm to 500 nm;
    the cathode buffer layer has a thickness ranging from 10 nm to 100 nm;
    the cathode has a thickness ranging from 50 nm to 150 nm.

19. The polymer photovoltaic cell (or solar cell) with an inverted structure according to claim 11 wherein said photo active organic polymer is selected from the group consisting of poly(3-hexylthiophene) (P3HT), PffBT4T-20D {poly[(5,6-difluoro-2,1,3-benzothiadiazol-4,7-diyl)-alt-(3, 3'''-di(2-octyldodecyl)-2,2',5',2'',5'',2'''-quaterthiophene-5, 5'''-diyl)]}, PBDTTPD {poly[[5-(2-ethylhexyl)-5,6-dihydro-4,6-dioxo-4H-thieno[3,4-c]pyrrole-1,3-diyl] [4,8-bis [(2-ethylhexyl)oxy]benzo[1,2-b:4,5-b']dithiophene-2,6-diyl]}; PTB7 {poly({4,8-bis[(2-ethylhexyl)oxo]benzo[1,2-b:4,5-b']dithiophene-2,6-diyl}{3-fluoro-2-[(2-ethylhexyl) carbonyl]thieno[3,4-b]thiophenediyl})}.

* * * * *